US005714284A

United States Patent [19]
Hirsh et al.

[11] Patent Number: 5,714,284
[45] Date of Patent: Feb. 3, 1998

[54] METHOD FOR MAKING WAVELENGTH-SELECTIVE PHASE-TYPE OPTICAL LOW-PASS ANTIALIASING FILTER

[75] Inventors: Jeffrey L. Hirsh, Rochester; Sharlene A. Wilson, Seneca Falls, both of N.Y.

[73] Assignee: Eastman Kodak Company, Rochester, N.Y.

[21] Appl. No.: 647,480

[22] Filed: May 14, 1996

[51] Int. Cl.$^6$ .................................... G03F 9/00
[52] U.S. Cl. .................... 430/5; 430/321; 430/326
[58] Field of Search ................. 430/5, 321, 326

[56] References Cited

U.S. PATENT DOCUMENTS

| 4,009,939 | 3/1977 | Okano | 350/162 |
| 4,083,627 | 4/1978 | Okano | 350/162 |
| 4,480,896 | 11/1984 | Kubo et al. | 350/431 |
| 5,585,885 | 12/1996 | Muramatsu | 396/111 |

*Primary Examiner*—Mark Chapman
*Attorney, Agent, or Firm*—Raymond L. Owens

[57] ABSTRACT

A method of forming a wavelength-selective optical low-pass antialiasing filter for use with an optical imaging system of a solid-state color imager or the like is disclosed. The method includes coating a transparent glass wafer with a layer of transparent photopatternable organic polymer material having a thickness that is equal to the thickness of randomly placed transparent low-pass antialiasing filter spots, exposing the transparent photopatternable layer in areas to form a pattern of randomly placed spots in unexposed areas that correspond to the optical low-pass antialiasing filter, and developing the exposed transparent photopatternable layer to remove the exposed regions corresponding to pattern of randomly placed transparent low-pass antialiasing filter spots.

3 Claims, 3 Drawing Sheets

METHOD FOR MAKING WAVELENGTH-SELECTIVE PHASE-TYPE OPTICAL LOW-PASS ANTIALIASING FILTER

CROSS REFERENCE TO RELATED APPLICATION

The present application is related to U.S. Provisional Ser. No. 60/002,392 filed Aug. 17, 1995 to Joseph F. Revelli, Jr. et al. and entitled "Wavelength-Selective Phase-Type Optical Low-Antialiasing Filter and Fabrication Methods," the disclosure of which is incorporated by reference herein.

FIELD OF THE INVENTION

The present invention relates to a method of making optical low-pass antialiasing filter to reduce or eliminate high spatial frequencies for selected wavelength bands while passing high spatial frequencies in other wavelength bands in order to minimize aliasing artifacts due to discrete sampling of images in image capture devices.

BACKGROUND OF THE INVENTION

Solid-state image capture devices often rely on an array of discrete light sensitive elements known as photosites to spatially sample an image of the object and produce sampled output. An example of solid-state device is electronic still cameras with color separation filters or single sensor element color video cameras. Because the image is sampled in a discrete manner, images recreated contain false signal content not present in the original object. This phenomenon is known as aliasing or moiré patterning and occurs at those spatial frequency components of the image which are equal to or greater than half the spatial sampling frequency of the photosite array, the so-called Nyquist frequency. In order to avoid aliasing, then, it is necessary to employ an optical low-pass antialiasing filter in the optical system to eliminate those spatial frequencies in the image of the object which exceed the Nyquist frequency.

In many color electronic image capture devices, the situation is further complicated by the fact that light incident on individual photosites is filtered by a primary color filter. Typically three filters of different color, e.g., red, green, or blue, are placed over individual photosites in order to sample the image of the object separately in each of the three wavelength bands. In recent years, in the case of red, green, and blue filters, particular attention has been paid to the fact the sampling frequency in the green wavelength band should be greater than the sampling frequencies in either the red or blue bands due to the fact that the human eye is most sensitive to higher spacial frequency components in the green region of the visible spectrum. For sensors designed in accord with this approach, the Nyquist frequency associated with photosites having red or blue color filters is generally less than that of those photosites associated with the green filter. Consequently, it would be desirable to design a low-pass optical filter which selectively eliminates spatial frequency components above the red or blue Nyquist frequency for the image sampled with photosites associated with the red or blue color filters while passing those same spatial frequency components for the image sampled with the portion of the photosite array associated with the green filter. Applications using a similar three color sampling scheme with color filters over photosites other than red, green, and blue may also benefit from a design of this type. Color imaging in the infrared portion of the optical spectrum is one potential example where three infrared wavelengths may be sampled in lieu of red, green, and blue and converted into visual wavelengths, e.g. red, green, blue, for display.

Particularly effective wavelength selective optical low-pass filters for use with an optical imaging system of a solid-state color imager are described by Revelli et al in commonly assigned U.S. Provisional Application Ser. No. 60/002,392, the disclosure of which is incorporated by reference herein. This filter comprises a transparent substrate and a plurality of transparent low-pass antialiasing filter spots randomly placed on the substrate for producing a phase difference between a wavefront transmitted through the spots and that portion of the substrate other than the low-pass antialiasing filter spots to define a filter having a spatial sampling cutoff frequency which varies depending on wavelength of light. This filter selectively aberrates wavelengths of light passing through it in such a way that the modulation transfer function (herein referred to as "MTF") of a combined lens-filter system is affected for spatial frequencies above $F_{ci}$. For a given wavelength $\lambda i$, assuming that the total area of the low-pass antialiasing filter spots is equal to the total area of the filter portion other than the spots, and ignoring the effects of a finite aperture, the MTF at the cutoff frequency, $M_{ci}$, is given by $$M_{ci} = \tfrac{1}{2}[1+\cos\phi] \tag{1}$$

wherein $$\phi = 2\pi q i \equiv 2\pi \frac{(ni - ni')}{\lambda_i} t \tag{2}$$

where ni=the refractive index of the spot material at a specific wavelength $\lambda_i$, ni'=the refractive index of the medium surrounding the spot, at a specific wavelength $\lambda i$, and t=the thickness of the spot.

The cut-off spatial frequency is given by $$F_{ci} = \alpha/b\lambda_i \tag{3}$$

wherein $\alpha$=mean diameter of the spots; and b=distance between the filter and the image plane.

If the thickness of the low-pass antialiasing filter spot is chosen to be such that the optical path difference, or OPD, is equal to a whole wavelength or an odd integer number of whole wavelengths of green light, that is if $$OPD_G \equiv (n_G - n_G')t = (2m_G + 1)\lambda_G$$

where $m_G$ is an integer number, then the phase shift, $\phi_G$, according to Eq. (2) becomes equal to an even integer multiple of p and $M_{cG}$ becomes equal to 1, according to Eq. (1). Furthermore, if the thickness of the spots, t, is chosen to give a green MTF, or $M_{cG}$ equal to 1, then the $M_{cR}$ and $M_{cB}$, the MTFs at cutoff for the red and blue wavelength bands, respectively, in general will be much less than one according to Eq. (1). In other words, the effect of the low-pass optical filter in the imaging system is to allow the contrast of the green portions of the image to remain high for spatial frequency components above the cutoff frequency, while at the same time reducing or even eliminating the contrast of the high spatial frequency components in the red and blue portions of the image. This filter has been found to be quite effective. However, the manufacturing process involves many steps.

Design and performance of several low-pass antialiasing filters are described by Revelli et al and here the fabrication schemes of some of these will be discussed. In U.S. Pat. No.

4,009,939 two sets of transmission gratings of precise period, orientation and thickness are produced by evaporation of two different materials through thin metal masks. U.S. Pat. No. 4,480,896 comprises phase spots of uniform height and can be produced by thermal evaporation of a material through a thin metal mask, or by other ion exchange method or photoresist method. U.S. Pat. No. 4,083,627 described two dimensional phase gratings which are formed by vacuum evaporation (apparently through thin metal masks). In the above-referenced commonly assigned Revelli et al provisional application, the low-pass antialiasing filters can be produced by several different schemes, including wet-etching the filter pattern into a substrate using a photoresist patterned mask and a buffered oxide etch to transfer the pattern into the substrate. Another technique described involves a trilayer dry-etch technique where a transparent polymer is spin deposited on a substrate and then coated with an etch-stop layer, such as silicon dioxide. Photoresist is deposited over the silicon dioxide and the image of the filter is patterned in the photoresist. This image is next transferred into the etch-stop layer using a suitable wet- or dry-etch technique, and then it is transferred into the organic polymer using a suitable dry-etch process, leaving the polymer low-pass antialiasing filter pattern on the substrate.

SUMMARY OF THE INVENTION

It is an object of the present invention to overcome one or more of the problems set forth above and particularly to define an improved method for making antialiasing optical low-pass filters.

This object is achieved in a method of forming a wavelength-selective optical low-pass antiliasing filter for use with an optical imaging system of a solid-state color imager or the like, the improvement comprising the steps of:
  a) coating a transparent glass wafer with a layer of transparent photopatternable organic polymer material having a thickness that is substantially equal to the thickness of randomly placed transparent low-pass antiliasing filter spots;
  b) exposing the transparent photopatternable layer in areas to form a pattern of randomly placed antiliasing filter spots in unexposed areas that correspond to the optical low-pass antiliasing filter; and
  c) developing the exposed transparent photopatternable layer to remove the exposed regions leaving behind a pattern of randomly placed transparent low-pass antiliasing filter spots.

ADVANTAGES

The present invention has advantages over the prior art. First is the ease of fabrication of the filter. In the present invention, the low-pass antialiasing filter is produced by first depositing a precise thickness of photopatternable material on the transparent substrate. The photopatternable material is then exposed in areas to form a pattern of randomly placed low-pass antialiasing filter spots in unexposed areas that correspond to the optical low-pass antialiasing filter. Next the exposed photopatternable material is developed to remove exposed regions and leave behind material corresponding to a pattern of randomly placed transparent low-pass antialiasing filter spots.

The requirements of the photopatternable materials selected are that they are optically transparent in the wavelength range of interest, that the thickness of the film be controllable, and that the photopatternable material used remain stable in transmission characteristics over time. Examples of such photopatternable materials include PMGI, polymethylmethacrylate (PMMA) and polyimides. The first two materials can be patterned with exposure to the deep UV portion of the light spectrum, and polyimides can be exposed to different wavelength ranges, depending on the specific material chosen.

Another advantage of the process described is that the thickness and uniformity of thickness of the photopatternable layer, and hence that of the patterned spots can be tightly controlled and reproduced, by using photopatternable materials, such as PMGI, PMMA, or polyimides, many of which are commercially available.

Another advantage of this invention is the ease or producing the pattern on the substrate, which is done by exposing the photopatternable material to light of the appropriate wavelength, through a photomask which corresponds to the low-pass antialiasing filter spots of the desired filter.

Another advantage of this invention is that low-pass antialiasing filter spots of much finer dimensions can be produced by photopatterning than can be produced by vacuum deposition of material through a thin metal shadow mask.

DETAILED DESCRIPTION OF THE INVENTION

Figure 1:
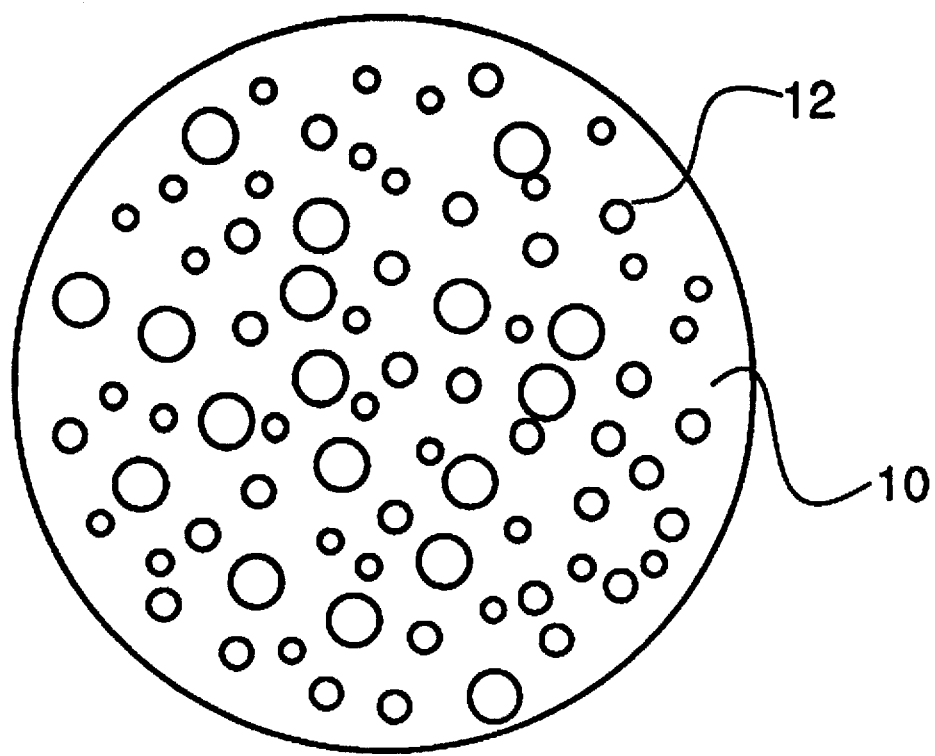
FIG. 1 is a magnified view of a portion of random blur low-pass antialiasing filter spots on a transparent glass wafer.

FIG. 1 shows a pattern of random blur low-pass antialiasing filter spots 12 which are formed on a transparent glass wafer or substrate 10 as will be described below. For a more complete disclosure of this arrangement, see the above reference Revelli et al provisional application.

Figure 2A:
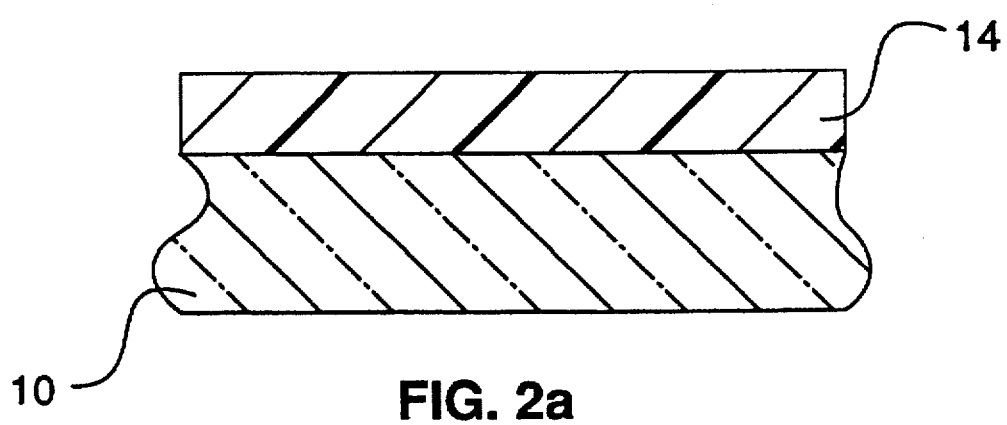
FIGS. 2a–2c show various stages in the process of making a filter in accordance with the present invention.

Turning now to FIG. 2a, there is shown the substrate 10. Upon the surface of the substrate 10 a transparent photopatternable layer 14 is spin coated. The layer 14 is formed of an organic polymer material which will have a thickness that is substantially equal to the thickness of randomly placed transparent low-pass antialiasing filter spots 12 which will be formed. The organic polymer material is preferably selected to be photosensitive in the 240–280 nm region of the spectrum. The selected thickness of the transparent photopatternable layer 14 is a function of the refractive index of the photopatternable material such that the desired filter effect is achieved as discussed above. The transparent photopatternable layer 14 can be formed of PMGI, PMMA, or a photopatternable polyimide.

Figure 2B:
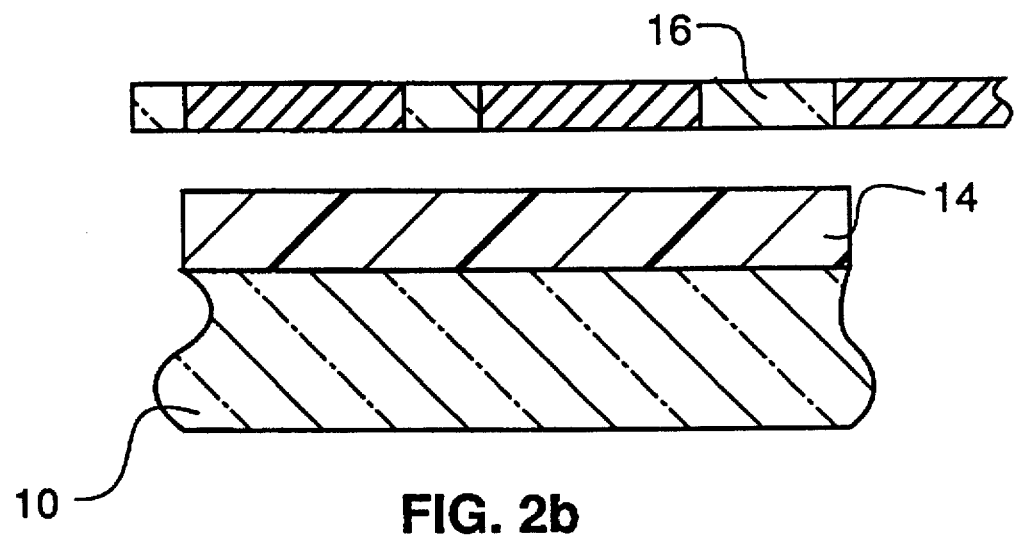

In FIG. 2b there is provided a conventional photomask 16 with openings defining the pattern of randomly spaced low-pass antialiasing filter spots. Light in an appropriate region of the spectrum (240–280 nm) passes through the openings in the photomask 16, exposes the transparent photopatternable layer 14, and creates spots in unexposed areas that correspond to an optical low-pass antialiasing filter. The size and thickness of these spots is discussed in the above-identified commonly assigned Revelli et al provisional applications. In the case of PMGI the appropriate region of the spectrum for the light source would be 240–280 nm.

Figure 2C:
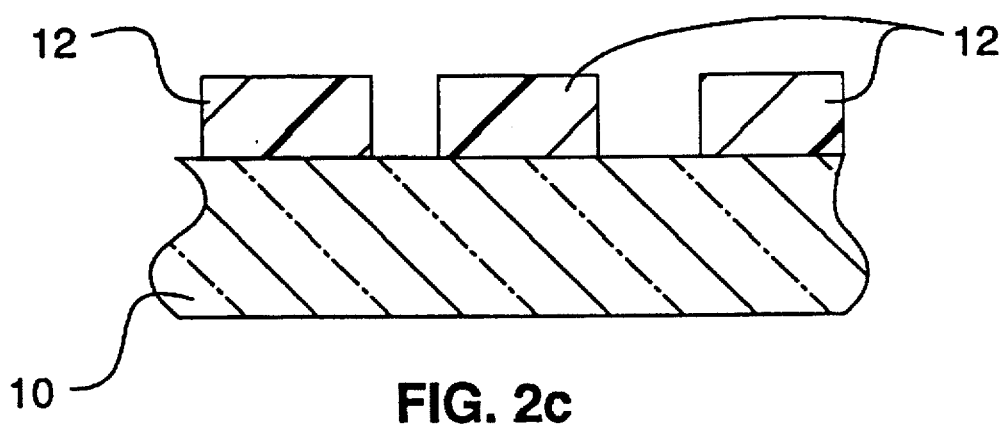

Thereafter, in FIG. 2c, a developer is applied and the exposed areas of the transparent photopatternable layer 14 are all removed leaving behind a pattern of low-pass antialiasing filter spots 12 which correspond to the pattern of randomly spaced low-pass antialiasing spots 12 as shown in FIG. 1.

The filter has been substantially completed. It may be appropriate for certain applications to trim the filter to an appropriate size. The filter is then placed in an optical image sensor system of a solid-state imager or the like.

Figure 3:
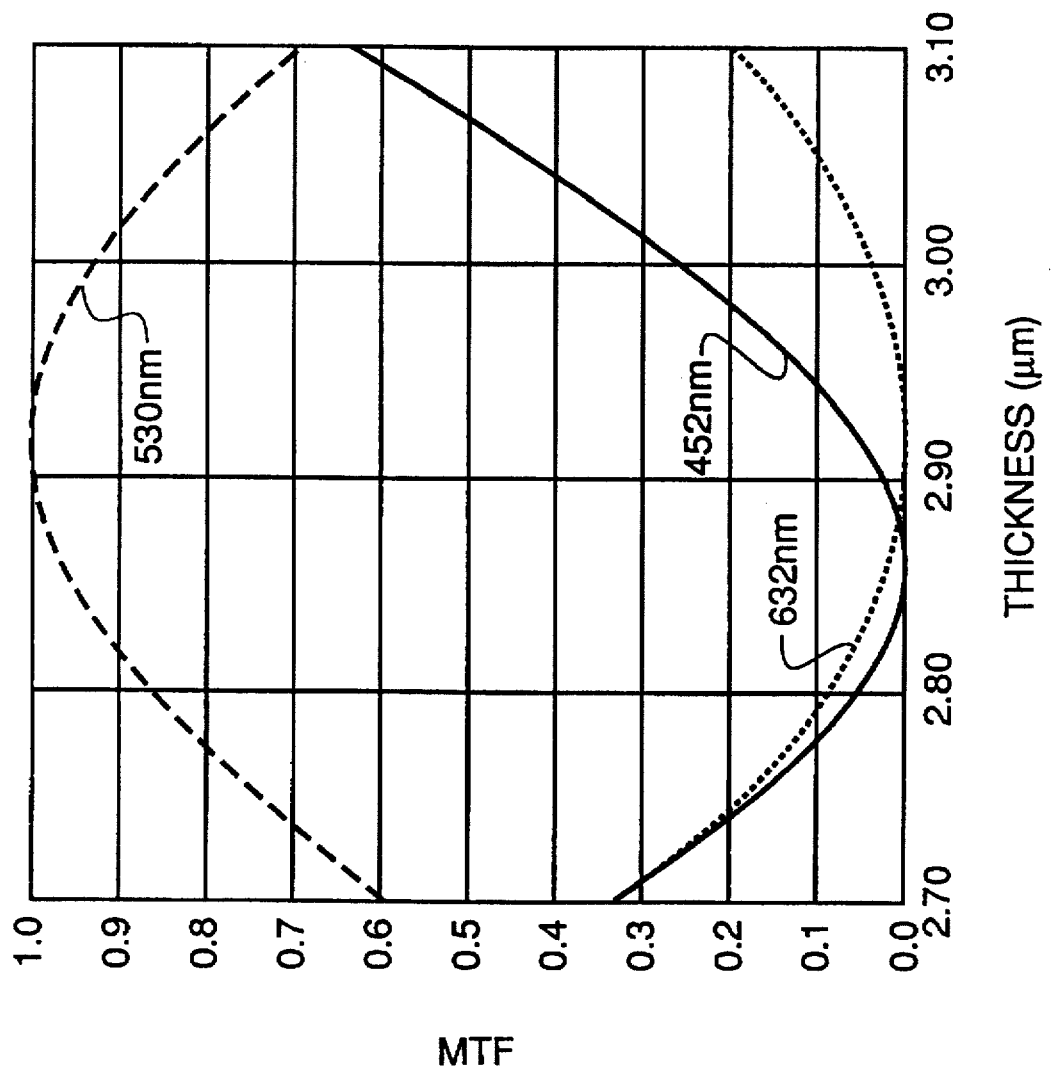
FIG. 3 is a plot showing MTF vs. spot thickness for the green, red, and blue wavelengths of the visible spectrum, for a solid state color imager having a Nyquist frequency of approximately 30 cycles/mm.

In the fabrication of the filters described by Revelli et al, it is necessary that the thickness of the low-pass antialiasing filter spots be held to specific tolerances of the design thickness for best filter performance. The reason for this requirement is that at the proper thickness the modulation transfer function (MTF) in the green wavelength range is high, while the corresponding red and blue wavelength MTFs are near zero, at the Nyquist frequency for the imaging system. At other thicknesses this is not the case. To demonstrate this fact, FIG. 3 shows a plot of MTF vs. spot thickness for green, red and blue wavelengths of the visible spectrum (or 530, 632, and 452 nm, respectively) for a solid state color imager having a Nyquist frequency of approximately 30 cycles/mm. The low-pass antialiasing filter spots in this filter are made from polymethylglutarimide (PMGI), a photopatternable polymer. One can see that, at the design thickness of 2.92 microns the red and blue MTF curves are at a low value, while the green MTF curve is near its maximum. Moving away from the design thickness quickly causes a rise in the MTF for the blue or red wavelengths, along with a corresponding decrease in green MTF. A change in thickness of 500 nm or more will severely harm the filter performance. Therefore, the thickness of the randomly spaced transparent spots must be substantially equal to the thickness of the layer which has the transparent low-pass antialiasing filter spots. It must be noted that the MTF curves shown are calculated for ideal red, green, and blue filters, filters that have a transmission of 1.0 at their design wavelengths, and transmission of 0 at the other two wavelengths. If the color filters chosen have different transmission than those described above, the actual MTF performance of the blue filter will be different than shown in FIG. 3, and the actual thickness of the blur filter spots may need to be changed to optimize the MTF of the system.

The invention has been described in detail with particular reference to certain preferred embodiments thereof, but it will be understood that variations and modifications can be effected within the spirit and scope of the invention.

| PARTS LIST | |
|---|---|
| 10 | transparent glass wafer or substrate |
| 12 | random blur filter spots |
| 14 | transparent photopatternable layer |
| 16 | photomask |

We claim:

1. In a method of forming a wavelength-selective optical low-pass and antialiasing filter for use with an optical imaging system of a solid-state color imager or the like, the improvement comprising the steps of:

a) coating a transparent glass wafer with a layer of transparent photopatternable organic polymer material having a thickness that is substantially equal to the thickness of randomly placed transparent low-pass antialiasing filter spots;

b) exposing the transparent photopatternable layer in areas to form a pattern of randomly placed low-pass antialiasing filter spots in unexposed areas that correspond to the optical low-pass antialiasing filter; and c) developing the exposed transparent photopatternable layer to remove the exposed regions leaving behind a pattern of randomly placed transparent low-pass antialiasing filter spots.

2. In a method of forming a wavelength-selective optical low-pass antialiasing filter for use with an optical imaging system of a solid-state color imager or the like, the improvement comprising the steps of:

a) coating a transparent glass wafer with a layer of transparent photopatternable organic polymer material which is photosensitive in the 240–280 nm region of the spectrum, such transparent photopatternable layer being selected to have a thickness that is substantially equal to the thickness of randomly placed transparent low-pass antialiasing filter spots;

b) exposing the transparent photopatternable layer to light in the 240–280 nm region of the spectrum; and c) developing the exposed transparent photopatternable layer to remove the exposed regions and leaving behind material in unexposed spot areas so that there is a pattern of randomly placed transparent low-pass antialiasing filter spots.

3. The method of claim 2 wherein the transparent organic polymer is selected from the group consisting of PMGI, PMMA, and photosensitive polyimides.

* * * * *